US008709925B2

(12) United States Patent
Kaeding et al.

(10) Patent No.: US 8,709,925 B2
(45) Date of Patent: Apr. 29, 2014

(54) METHOD FOR CONDUCTIVITY CONTROL OF (AL,IN,GA,B)N

(75) Inventors: John F. Kaeding, Mountain View, CA (US); Hitoshi Sato, Kanagawa (JP); Michael Iza, Goleta, CA (US); Hirokuni Asamizu, Goleta, CA (US); Hong Zhong, Temple City, CA (US); Steven P. DenBaars, Goleta, CA (US); Shuji Nakamura, Santa Barbara, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 13/440,234

(22) Filed: Apr. 5, 2012

(65) Prior Publication Data

US 2012/0187415 A1 Jul. 26, 2012

Related U.S. Application Data

(63) Continuation of application No. 11/673,426, filed on Feb. 9, 2007, now Pat. No. 8,193,079.

(60) Provisional application No. 60/772,184, filed on Feb. 10, 2006.

(51) Int. Cl.
H01L 21/04 (2006.01)

(52) U.S. Cl.
USPC 438/510; 257/76; 257/E29.004; 257/E29.093

(58) Field of Classification Search
USPC ............ 438/510; 257/76, E21.11, E21.113, 257/E21.121, E29.004, E29.093
See application file for complete search history.

(56) References Cited

U.S. PATENT DOCUMENTS

| 5,306,662 | A  | 4/1994  | Nakamura et al. |
| 6,153,010 | A  | 11/2000 | Kiyoku et al.   |
| 6,316,785 | B1 | 11/2001 | Nunoue et al.   |
| 6,599,362 | B2 | 7/2003  | Ashby et al.    |
| 6,635,904 | B2 | 10/2003 | Goetz et al.    |
| 6,847,057 | B1 | 1/2005  | Gardner et al.  |
| 7,220,324 | B2 | 5/2007  | Baker et al.    |

(Continued)

FOREIGN PATENT DOCUMENTS

| JP | 2004-111514 | 4/2004 |
| JP | 2006186257  | 7/2006 |

(Continued)

OTHER PUBLICATIONS

Supplementary European Search Report, Application No. EP 07750442, dated Oct. 13, 2010.
International Search Report, International application No. PCT/US07/03607, date of mailing Sep. 23, 2008.

(Continued)

Primary Examiner — Colleen Matthews
Assistant Examiner — Colleen E Snow
(74) Attorney, Agent, or Firm — Gates & Cooper LLP

(57) ABSTRACT

A method of controlled p-type conductivity in (Al,In,Ga,B)N semiconductor crystals. Examples include {10$\bar{1}$1} GaN films deposited on {100} MgAl$_2$O$_4$ spinel substrate miscut in the <011> direction. Mg atoms may be intentionally incorporated in the growing semipolar nitride thin film to introduce available electronic states in the band structure of the semiconductor crystal, resulting in p-type conductivity. Other impurity atoms, such as Zn or C, which result in a similar introduction of suitable electronic states, may also be used.

24 Claims, 6 Drawing Sheets

(56) References Cited

U.S. PATENT DOCUMENTS

| | | |
|---|---|---|
| 2002/0084467 A1 | 7/2002 | Krames et al. |
| 2002/0144645 A1 | 10/2002 | Kim et al. |
| 2002/0177251 A1* | 11/2002 | Ye et al. .................... 438/47 |
| 2003/0024475 A1 | 2/2003 | Anderson |
| 2005/0142391 A1 | 6/2005 | Dmitriev et al. |
| 2005/0161697 A1 | 7/2005 | Nakahata et al. |
| 2005/0218414 A1 | 10/2005 | Ueda et al. |
| 2005/0258451 A1 | 11/2005 | Saxler et al. |
| 2006/0073680 A1 | 4/2006 | Han et al. |
| 2007/0015345 A1 | 1/2007 | Baker et al. |
| 2007/0077674 A1 | 4/2007 | Okuyama et al. |
| 2007/0093073 A1 | 4/2007 | Farrell et al. |

FOREIGN PATENT DOCUMENTS

| | | |
|---|---|---|
| WO | 2004084275 | 9/2004 |
| WO | 2005043638 | 5/2005 |
| WO | 2005/112123 | 11/2005 |

OTHER PUBLICATIONS

JP Office Action dated Nov. 15, 2011 (JP Application No. 2008-554403) with English translation.

Baker, T. et al., "Characterization of planar semipolar gallium nitride films on spinel substrates," Japanese Journal of Applied Physics, vol. 44, No. 29, 2005, pp. L920-L922.

Tsuchiya, Y. et al., "Control of p-type conduction in a-plane GaN grown on sapphire r-plane substrate," Japanese Journal of Applied Physics, vol. 44, No. 50, 2005, pp. L1516-1518.

Shao, Y-P. et al., "Electrical Characterization of Semipolar Gallium Nitride Thin Films", NNIN REU Research Accomplishments, Aug. 2005, pp. 132-133.

Nakamura, S. et al., "Thermal Annealing Effects on P-Type Mg-Doped GaN Films," Jpn. J. Appl. Phys. 1992, 31(Part 2 No. 2B):L139-L142.

Waki, I. et al., "Low-temperature activation of Mg-doped GaN using Ni films," Appl. Phys. Lett. 2001, 78(19):2899-2901.

Japanese Office Action (with English translation) dated Dec. 10, 2012 for Japanese Patent Application No. 2008-554403.

\* cited by examiner

METHOD FOR CONDUCTIVITY CONTROL OF (AL,IN,GA,B)N

CROSS-REFERENCE TO RELATED APPLICATIONS

This application is a continuation under 35 U.S.C. §120 of co-pending and commonly-assigned U.S. Utility patent application Ser. No. 11/673,426, filed Feb. 9, 2007 by John F. Kaeding, Hitoshi Sato, Michael Iza, Hirokuni Asamizu, Hong Zhong, Steven P. DenBaars, and Shuji Nakamura, entitled "METHOD FOR CONDUCTIVITY CONTROL OF SEMI-POLAR (Al,In,Ga,B)N", which application claims the benefit under 35 U.S.C. Section 119(e) of U.S. Provisional Patent Application Ser. No. 60/772,184, filed on Feb. 10, 2006 by John F. Kaeding, Hitoshi Sato, Michael Iza, Hirokuni Asamizu, Hong Zhong, Steven P. DenBaars and Shuji Nakamura, entitled "METHOD FOR CONDUCTIVITY CONTROL OF SEMIPOLAR (Al,In,Ga,B)N";

all of which applications are incorporated by reference herein.

This application is related to the following co-pending and commonly-assigned applications:

U.S. Utility patent application Ser. No. 11/372,914 filed Mar. 10, 2006, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE," now U.S. Pat. No. 7,220,324, issued on May 22, 2007, which application claims the benefit under 35 U.S.C. Section 119(e) of U.S. Provisional Patent Application Ser. No. 60/660,283, filed Mar. 10, 2005, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE";

U.S. Utility patent application Ser. No. 11/444,946, filed Jun. 1, 2006, by Robert M. Farrell, Jr., Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga,Al,In,B)N THIN FILMS, HETEROSTRUCTURES, AND DEVICES," now U.S. Pat. No. 7,846,757, issued on Dec. 7, 2010, which application claims the benefit under 35 U.S.C. Section 119(e) of U.S. Provisional Patent Application Ser. No. 60/686,244, filed Jun. 1, 2005, by Robert M. Farrell, Jr., Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga,Al,In,B)N THIN FILMS, HETEROSTRUCTURES, AND DEVICES";

U.S. Utility patent application Ser. No. 11/486,224, filed Jul. 13, 2006, by Troy J. Baker, Benjamin A. Haskell, James S. Speck and Shuji Nakamura, entitled "LATERAL GROWTH METHOD FOR DEFECT REDUCTION OF SEMIPOLAR NITRIDE FILMS," now U.S. Pat. No. 8,148,244, issued on Apr. 3, 2012, which application claims the benefit under 35 U.S.C. Section 119(e) of U.S. Provisional Patent Application Ser. No. 60/698,749, filed Jul. 13, 2005, by Troy J. Baker, Benjamin A. Haskell, James S. Speck, and Shuji Nakamura, entitled "LATERAL GROWTH METHOD FOR DEFECT REDUCTION OF SEMIPOLAR NITRIDE FILMS";

U.S. Utility patent application Ser. No. 11/517,797, filed Sep. 8, 2006, by Michael Iza, Troy J. Baker, Benjamin A. Haskell, Steven P. DenBaars, and Shuji Nakamura, entitled "METHOD FOR ENHANCING GROWTH OF SEMIPOLAR (Al,In,Ga,B)N VIA METALORGANIC CHEMICAL VAPOR DEPOSITION," now U.S. Pat. No. 7,575,947, issued on Aug. 18, 2009, which application claims the benefit under 35 U.S.C. Section 119(e) of U.S. Provisional Patent Application Ser. No. 60/715,491, filed Sep. 9, 2005, by Michael Iza, Troy J. Baker, Benjamin A. Haskell, Steven P. DenBaars, and Shuji Nakamura, entitled "METHOD FOR ENHANCING GROWTH OF SEMIPOLAR (Al,In,Ga,B)N VIA METALORGANIC CHEMICAL VAPOR DEPOSITION";

U.S. Utility patent application Ser. No. 11/523,286, filed on Sep. 18, 2006, by Siddharth Rajan, Chang Soo Suh, James S. Speck and Umesh K. Mishra, entitled "N-POLAR ALUMINUM GALLIUM NITRIDE/GALLIUM NITRIDE ENHANCEMENT-MODE FIELD EFFECT TRANSISTOR," now U.S. Pat. No. 7,948,011, issued on May 24, 2011, which application claims the benefit under 35 U.S.C. Section 119(e) of U.S. Provisional Patent Application Ser. No. 60/717,996, filed on Sep. 16, 2005, by Siddharth Rajan, Chang Soo Suh, James S. Speck and Umesh K. Mishra, entitled "N-POLAR ALUMINUM GALLIUM NITRIDE/ GALLIUM NITRIDE ENHANCEMENT-MODE FIELD EFFECT TRANSISTOR";

U.S. Utility patent application Ser. No. 11/655,573, filed on Jan. 19, 2007, by John Kaeding, Dong-Seon Lee, Michael Iza, Troy J. Baker, Hitoshi Sato, Benjamin A. Haskell, James S. Speck, Steven P. Denbaars and Shuji Nakamura, entitled "METHOD FOR IMPROVED GROWTH OF SEMIPOLAR (AL,IN,GA,B)N," now U.S. Pat. No. 7,691,658, issued on Apr. 6, 2010, which application claims the benefit under 35 U.S.C. Section 119(e) of U.S. Provisional Patent Application Ser. No. 60/760,739, filed on Jan. 20, 2006, by John Kaeding, Michael Iza, Troy J. Baker, Hitoshi Sato, Benjamin A. Haskell, James S. Speck, Steven P. Denbaars and Shuji Nakamura, entitled "METHOD FOR IMPROVED GROWTH OF SEMIPOLAR (AL,IN,GA,B)N";

U.S. Utility patent application Ser. No. 11/655,572 filed on Jan. 19, 2007, by Hitoshi Sato, John Kaeding, Michael Iza, Troy J. Baker, Benjamin A. Haskell, Steven P. DenBaars and Shuji Nakamura, entitled "METHOD FOR ENHANCING GROWTH OF SEMIPOLAR (Al,In,Ga,B)N VIA METALORGANIC CHEMICAL VAPOR DEPOSITION," now U.S. Pat. No. 7,687,293, issued on Mar. 30, 2010, which application claims the benefit under 35 U.S.C. Section 119(e) of U.S. Provisional Patent Application Ser. No. 60/760,628 filed on Jan. 20, 2006, by Hitoshi Sato, John Kaeding, Michael Iza, Troy J. Baker, Benjamin A. Haskell, Steven P. DenBaars and Shuji Nakamura entitled "METHOD FOR ENHANCING GROWTH OF SEMIPOLAR (Al,In,Ga,B)N VIA METALORGANIC CHEMICAL VAPOR DEPOSITION";

U.S. Provisional Patent Application Ser. No. 60/774,467, filed on Feb. 17, 2006, by Hong Zhong, John F. Kaeding, Rajat Sharma, James S. Speck, Steven P. DenBaars and Shuji Nakamura, entitled "METHOD FOR GROWTH OF SEMIPOLAR (Al,In,Ga,B) N OPTOELECTRONICS DEVICES";

U.S. Provisional Patent Application Ser. No. 60/798,933, filed on May 9, 2006, by Arpan Chakraborty, Kwang-Choong Kim, Steven P. DenBaars, James S. Speck, and Umesh K. Mishra, entitled "TECHNIQUE FOR DEFECT REDUCTION IN NONPOLAR AND SEMIPOLAR GALLIUM NITRIDE FILMS USING IN-SITU SILICON NITRIDE NANOMASKING";

U.S. Provisional Patent Application Ser. No. 60/809,774, filed on May 31, 2006, by Nicholas A. Fichtenbaum, Umesh K. Mishra, Carl J. Neufeld and Stacia Keller, entitled "OPTO- ELECTRONIC DEVICES FORMED BY REGROWTH ON N-POLAR NANOPILLAR AND NANOSTRIPE ARRAYS";

U.S. Provisional Patent Application Ser. No. 60/822,600, filed on Aug. 16, 2006, by Michael Iza, Hitoshi Sato, Steven P. DenBaars, and Shuji Nakamura, entitled "METHOD FOR DEPOSITION OF MAGNESIUM DOPED (Al, In, Ga, B)N LAYERS";

U.S. Provisional Patent Application Ser. No. 60/866,035, filed on Nov. 15, 2006, by Stacia Keller, Umesh K. Mishra, and Nicholas A. Fichtenbaum, entitled "METHOD FOR HETEROEPITAXIAL GROWTH OF HIGH-QUALITY N-FACE GaN, InN, and AlN AND THEIR ALLOYS BY METAL ORGANIC CHEMICAL VAPOR DEPOSITION";

U.S. Provisional Patent Application Ser. No. 60/869,540, filed on Dec. 11, 2006, by Steven P. DenBaars, Mathew C. Schmidt, Kwang Choong Kim, James S. Speck and Shuji Nakamura, entitled "NON-POLAR (M-PLANE) AND SEMI-POLAR EMITTING DEVICES"; and U.S. Provisional Patent Application Ser. No. 60/869,701, filed on Dec. 12, 2006, by Kwang Choong Kim, Mathew C. Schmidt, Feng Wu, Asako Hirai, Melvin B. McLaurin, Steven P. DenBaars, Shuji Nakamura and James S. Speck, entitled "CRYSTAL GROWTH OF M-PLANE AND SEMIPOLAR PLANES OF (Al, In, Ga, B)N ON VARIOUS SUBSTRATES";

which applications are incorporated by reference herein.

BACKGROUND OF THE INVENTION

1. Field of the Invention

This invention is related to a method for conductivity control of (Al,In,Ga,B)N.

2. Description of the Related Art (Note: This application references a number of different publications and patents as indicated throughout the specification by one or more reference numbers within brackets, e.g., [x]. A list of these different publications and patents ordered according to these reference numbers can be found below in the section entitled "References." Each of these publications and patents is incorporated by reference herein.)

The usefulness of gallium nitride (GaN) and its ternary and quaternary compounds, incorporating aluminum and indium (AlGaN, InGaN, AlInGaN), has been well established for fabrication of visible and ultraviolet optoelectronic devices and high-power electronic devices. These devices are typically grown epitaxially using growth techniques including molecular beam epitaxy (MBE), metalorganic chemical vapor deposition (MOCVD), and hydride vapor phase epitaxy (HVPE).

Semiconductor optoelectronic devices typically rely on the transition of electrons between filled and unfilled electronic states, with the subsequent emission or absorption of photons of light. State-of-the-art optoelectronic devices, such as light emitting diodes (LEDs), laser diodes (LDs), or photovoltaic cells, incorporate a semiconductor diode junction. A diode junction results from a transition within or between regions of the semiconductor with differing n- and p-type carriers. An n-type semiconductor refers to a material with a net excess of free charge carriers within the conduction band of the semiconductor crystal. A p-type semiconductor refers to a material with a net excess of free charge carriers within the valence band of the semiconductor crystal. Therefore, the fabrication of optoelectronic semiconductor devices depends on the ability to intentionally modulate the concentration and type of free charge carrier within or between regions of the semiconductor crystal.

GaN and its alloys are most stable in the hexagonal wurtzite crystal structure, in which the structure is described by two (or three) equivalent basal plane axes that are rotated 120° with respect to each other (the a-axes), all of which are perpendicular to a unique c-axis. Group III and nitrogen atoms occupy alternating c-planes along the crystal's c-axis. The symmetry elements included in the wurtzite structure dictate that III-nitrides possess a bulk spontaneous polarization along this c-axis, and the wurtzite structure exhibits piezoelectric polarization.

Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn give rise to restricted carrier recombination efficiency, reduced oscillator strength, and red-shifted emission.

One approach to eliminating the spontaneous and piezoelectric polarization effects in GaN optoelectronic devices is to grow the devices on nonpolar planes of the crystal. Such planes contain equal numbers of Ga and N atoms and are charge-neutral. Furthermore, subsequent nonpolar layers are crystallographically equivalent to one another so the crystal will not be polarized along the growth direction. Two such families of symmetry-equivalent nonpolar planes in GaN are the $\{11\bar{2}0\}$ family, known collectively as a-planes, and the $\{1\bar{1}00\}$ family, known collectively as m-planes. Unfortunately, despite advances made by researchers at the University of California, the assignee of the present invention, growth of nonpolar nitrides remains challenging and has not yet been widely adopted in the III-nitride industry.

Another approach to reducing or possibly eliminating the polarization effects in GaN optoelectronic devices is to grow the devices on semipolar planes of the crystal. The term semipolar planes can be used to refer to a wide variety of planes that possess two nonzero h, i, or k Miller indices, and a nonzero l Miller index. Some commonly observed examples of semipolar planes in c-plane GaN heteroepitaxy include the $\{11\bar{2}2\}$, $\{10\bar{1}1\}$, and $\{10\bar{1}3\}$ planes, which are found in the facets of pits. These planes also happen to be the same planes that the authors have grown in the form of planar films. Other examples of semipolar planes in the wurtzite crystal structure include, but are not limited to, $\{10\bar{1}2\}$, $\{20\bar{2}1\}$, and $\{10\bar{1}4\}$. The nitride crystal's polarization vector lies neither within such planes or normal to such planes, but rather lies at some angle inclined relative to the plane's surface normal. For example, the $\{10\bar{1}1\}$ and $\{10\bar{1}3\}$ planes are at 62.98° and 32.06° to the c-plane, respectively.

In addition to spontaneous polarization, the second form of polarization present in nitrides is piezoelectric polarization. This occurs when the material experiences a compressive or tensile strain, as can occur when (Al, In, Ga, B)N layers of dissimilar composition (and therefore different lattice constants) are grown in a nitride heterostructure. For example, a thin AlGaN layer on a GaN template will have in-plane tensile strain, and a thin InGaN layer on a GaN template will have in-plane compressive strain, both due to poor lattice matching to the GaN. Therefore, for an InGaN quantum well on GaN, the piezoelectric polarization will point in the opposite direction than that of the spontaneous polarization of the InGaN and GaN. For an AlGaN layer latticed matched to GaN, the piezoelectric polarization will point in the same direction as that of the spontaneous polarization of the AlGaN and GaN.

Nakamura, et al. developed the first high quality p-type GaN material using magnesium (Mg) doping and a subsequent thermal annealing step. Both this technique and subsequent improvements by other researchers are described in references [1,2,3]. However, these techniques use GaN films grown along the polar [0001] direction. The advantage of using semipolar planes over c-plane nitrides is that the total polarization will be reduced. There may even be zero polarization for specific alloy compositions on specific planes. What is most important is that the polarization be reduced compared to that of c-plane nitride structures. Therefore, significant improvements may be made using semipolar growth orientations which alter the band structure, and therefore the conductivity, of the semiconductor crystal.

Conventional c-plane oriented nitride semiconductor crystals doped with Mg have p-type carrier concentrations approximately 100 times lower than the Mg dopant concentration due to the electronic band structure of the doped, polar nitride crystal. However, the present invention results in semipolar nitride semiconductor crystals with a p-type carrier concentration only a factor of 10 lower than the Mg dopant concentration. In other words, the doping concentration can be dramatically increased compared to that of polar nitride crystals. This enhanced Mg activation makes the present invention superior to conventional polar nitride p-type doping techniques. Another new feature of the invention results in p-type (Al,In,Ga,B)N films that exhibit both high hole concentrations $>10^{18}$ cm$^{-3}$, while at the same time maintaining Hall mobilities of 8-14 cm$^2$/Vs. In other words, the carrier concentration and mobility can be simultaneously increased or maximized, and are higher than for polar nitrides. Traditional c-plane oriented p-type nitride semiconductor crystal exhibits much lower mobilities for equivalent hole concentrations. The resulting product of hole mobility and concentration results in a higher conductivity for (Al,In,Ga,B)N semiconductor crystal fabricated using this invention.

The present invention allows for p-type conductivity control in nitride (Al,In,Ga,B)N semiconductor crystals. Although p-type conductivity control has been previously reported for nitride semiconductors, the use of the semipolar and nonpolar planes to control the p-type conductivity in a nitride semiconductor has not been disclosed.

SUMMARY OF THE INVENTION

The present invention discloses a method for enhancing or tailoring conductivity properties in a nitride device or semiconductor nitride comprising fabricating the nitride device or semiconductor nitride using a doped semipolar or nonpolar nitride semiconductor. The enhancing or tailoring may comprise tailoring band structure, improved conductivity control, increasing dopant activation by increasing the number of dopants that contribute to carrier concentration, simultaneously increasing carrier concentration and mobility and thereby increasing conductivity, reducing hole mass, introducing degrees of freedom or anisotropic in-plane electronic properties, or reducing unintentional impurities. Thus, the present invention describes a method for controlling the conductivity of device-quality nitride semiconductor crystals. The semipolar or nonpolar orientation of the nitride semiconductor results in improved conductivity control relative to typical polar [0001] nitride semiconductors, higher carrier concentration and higher mobility than polar nitride semiconductors. The doped semipolar or nonpolar nitride semiconductor may be p-type doped for enhancing or tailoring the p-type conductivity properties of the nitride device or semiconductor nitride.

The present invention also discloses a method for growing semipolar or nonpolar nitride, comprising controlling conductivity, for example p-type conductivity, of the semipolar or nonpolar nitride semiconductor by varying a miscut angle of the miscut substrate and depositing the semipolar or non polar nitride semiconductor on a miscut substrate. The miscut substrate may be a {100} MgAl$_2$O$_4$ spinel substrate miscut in a <011> direction.

The semipolar nitride semiconductor may comprise {10$\bar{1}$1} gallium nitride (GaN), or the semipolar nitride semiconductor may comprise {10$\bar{1}$3} or {11$\bar{2}$2} semipolar (Al,In,Ga,B)N. The nonpolar nitride semiconductor may comprise a-plane or m-plane nonpolar (Al, In, Ga, B)N.

The method may comprise incorporating dopants either intentionally or unintentionally in the nitride semiconductor during the deposition step. The dopants may comprise Silicon (Si), Magnesium (Mg), Zinc (Zn) or Carbon (C). The unintentional dopant may be hydrogen with a concentration of less than $1 \times 10^{19}$ cm$^{-3}$.

The method may further comprise performing a subsequent thermal annealing step, after the deposition step, which alters a concentration of unintentional impurity atoms, such as hydrogen, within the semipolar nitride semiconductor, and results in an improvement in the conductivity of the semipolar nitride semiconductor crystals.

The present invention also discloses a semipolar or nonpolar nitride semiconductor incorporating one or more dopants for modulating the conductivity of the semipolar or nonpolar nitride semiconductor. The dopants may impart a p-type conductivity to the semipolar or nonpolar nitride semiconductor and the semipolar or nonpolar nitride semiconductor may comprise a hole concentration greater than $10^{18}$ cm$^{-3}$ while maintaining a Hall mobility of at least 8 cm$^2$/Vs. The dopants, typically magnesium, impart a p-type conductivity to the semipolar or nonpolar nitride semiconductor and the semipolar or nonpolar nitride semiconductor may comprise a carrier concentration at most 10 times lower than the dopant concentration.

The present invention also allows the fabrication of practical semipolar or nonpolar nitride devices, such as light emitting diodes and laser diodes.

BRIEF DESCRIPTION OF THE DRAWINGS

Referring now to the drawings in which like reference numbers represent corresponding parts throughout.

DETAILED DESCRIPTION OF THE INVENTION

Figure 1:
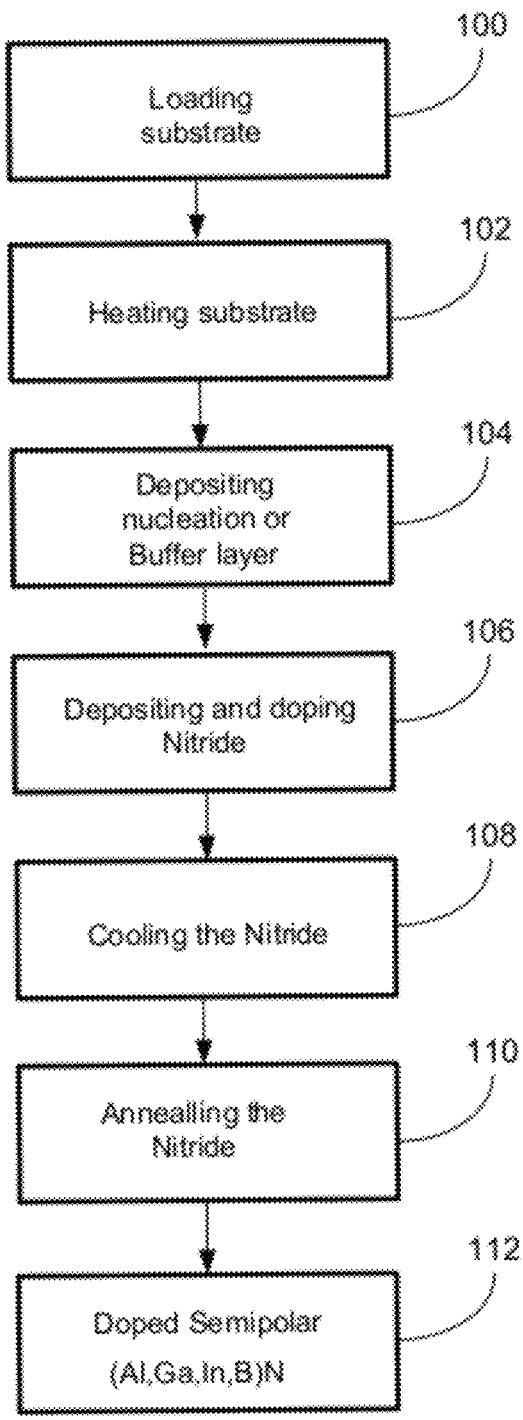
FIG. 1 is a flowchart that illustrates the method of the present invention and the preferred embodiment which comprises a MOCVD process for the growth of semipolar GaN thin films on a spinel substrate.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention comprises a method of controlled p-type conductivity in (Al,In,Ga,B)N semiconductor crystals by doping of a semipolar nitride crystal. Examples of such control have been demonstrated using $\{10\bar{1}1\}$ GaN films deposited on $\{100\}$ $MgAl_2O_4$ spinel substrates miscut in the <011> direction. In one embodiment of the invention, magnesium atoms are intentionally incorporated in the growing semipolar nitride film to introduce available electronic states in the band structure of the semiconductor crystal, resulting in p-type conductivity. Other impurity atoms, such as Zinc (Zn) or Carbon (C), which result in a similar introduction of suitable electronic states, may also be used.

Technical Description

In one embodiment, the $\{10\bar{1}1\}$ GaN films are grown using a commercially available MOCVD system. A general outline of growth parameters for $\{10\bar{1}1\}$ GaN is a pressure between 10 ton and 1000 ton, and a temperature between 400° C. and 1400° C. This variation in pressure and temperature is indicative of the stability of the growth of GaN using a suitable substrate. The epitaxial relationships and conditions should hold true regardless of the type of reactor. However, the reactor conditions for growing these planes will vary according to individual reactors and growth methods (HYPE, MOCVD, and MBE, for example). Bis(cyclopentadienyl) magnesium ($Cp_2Mg$) may be used as the source of Mg dopant atoms. Other suitable sources of impurity atoms may be used and the source selection may be determined in part on the growth technique used. For example, an elemental Mg source may be used as a dopant source for conductivity control of semipolar nitride semiconductors grown by MBE. The choice of dopant source and growth technique may be varied without departing from the scope of this invention.

The concentration of impurity dopant atoms in the growing semiconductor film may be controlled by one knowledgeable in the art of semiconductor growth through a suitable modification of the growth conditions. For example, the concentration of Mg, [Mg], in a semipolar GaN crystal grown by MOCVD may be altered by changing the ratio of Ga:Mg metalorganic precursor molecules. Additional, but non-exclusive, techniques include intentionally varying the growth rate, pressure, temperature or ambient gas composition.

During the growth of the semipolar crystal, additional impurity atoms may be either intentionally or unintentionally incorporated in the semiconductor crystal. Some of these atoms may interact with intentional dopant atoms to alter the electrical activity of the dopant atom, affecting conductivity control. For example, it is known that interaction between hydrogen (H) and Mg in [0001] oriented GaN crystals prevents p-type conductivity. However, if the H-containing semiconductor crystal is placed in an H deficient environment, and suitable thermal energy is provided, the H will diffuse out of the nitride crystal resulting in p-type conductivity. This process is known as activation.

The band structure of (Al,In,Ga,B)N semiconductor crystals along a semipolar crystal direction results in a variation in the electrical behavior p-type dopant atoms relative to (Al,In,Ga,B)N grown along polar crystal directions. Therefore, the present invention describes a method of conductivity control in nitride crystals by doping and activating semipolar (Al,In,Ga,B)N semiconductor crystals.

Process Steps

FIG. 1 illustrates the steps of the MOCVD process for the growth on semipolar GaN thin films on a spinel substrate according to the preferred embodiment of the present invention. FIG. 1 also illustrates a method for enhancing or tailoring conductivity properties in nitride devices comprising fabricating the nitride device using a doped semipolar nitride semiconductor.

Block 100 represents the step of loading a substrate into a reactor, for example an MOCVD reactor. The substrate may or may not have a miscut. Any suitable substrate for the deposition of nitrides may be used.

Block 102 represents the step of heating the substrate, for example under hydrogen and/or nitrogen and/or ammonia.

Block 104 represents the optional step of depositing a nucleation or buffer layer on the substrate. The nucleation layer can be made of any suitable material for the growth of semiconductor nitrides.

Block 106 represents the step of depositing and doping, for example with Mg, a semipolar nitride semiconductor, for example, a GaN film, on the nucleation layer, or directly on the substrate.

Block 108 represents the step of cooling the semipolar nitride.

Block 110 represents the step of annealing the semipolar nitride, for example in a Hydrogen (H) deficient ambient gas.

Block 112 represents the result of this method, a semipolar nitride semiconductor incorporating one or more dopants for modulating the conductivity of the semipolar nitride semiconductor, for example, a doped p-type semipolar (Al,Ga,In,B)N film. A device may also be fabricated using the method of FIG. 1. Steps may be added or omitted as desired.

As an example, for the growth of $\{10\bar{1}1\}$ GaN, a (100) spinel substrate is used with a miscut in the <011> direction. The substrate is loaded into an MOCVD reactor, as represented in Block 100. The heater is turned on and ramped to a set point temperature of 1025° C. under conditions to encourage nitridization of the surface of the substrate, as represented in Block 102. Generally, nitrogen and/or hydrogen and/or ammonia are flowed over the substrate at atmospheric pressure. Once the set point temperature is reached, the ammonia flow is set to 0.1 to 3.0 slpm. After 1 to 20 minutes, the reactor set point temperature is maintained at 1025° C., the reactor pressure is reduced to 76 torr, and 0 to 3 sccm of Trimethylgallium (TMGa) and/or 20 sccm of Trimethylaluminum (TMAl) are introduced into the reactor to initiate the $Al_xGa_{1-x}N$ buffer or nucleation layer growth, as represented in Block 104. After 1-40 minutes, the $Al_xGa_{1-x}N$ nucleation layer reaches the desired thickness. At this point, the TMAl flow is shut off, the measured heater temperature is decreased to 975° C., the reactor pressure is increased to 760 torr, and the TMGa flow is increased to 9.5 sccm for approximately 1 to 4 hours of GaN growth, as represented in Block 106. At any time during the step represented by Block 106, an additional flow of $Cp_2Mg$ may be started to produce p-type GaN. The flow of $Cp_2Mg$ is typically varied from greater than 0 and up to 0.3 µmol/min, depending on the [Mg] concentration desired in the growing film. Once the desired p-type GaN thickness is achieved, the $Cp_2Mg$ flow is interrupted. Once the desired total GaN thickness is achieved, the TMGa flow is interrupted and the reactor is cooled down, as represented in Block 108, while flowing ammonia and/or nitrogen and/or hydrogen to preserve the GaN film.

Figure 2:
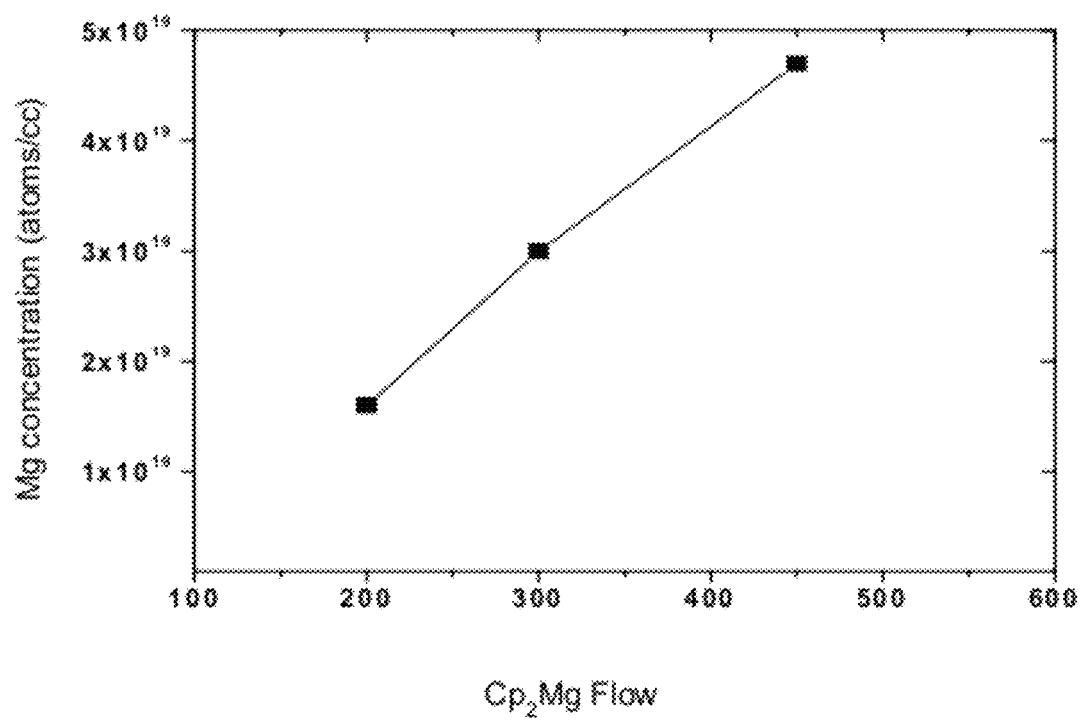
FIG. 2 is a graph showing Cp$_2$Mg flow versus Mg concentration.

The method of magnesium incorporation described herein results in a magnesium concentration incorporated in the crystal of less than $5\times10^{19}$ cm$^{-3}$ as measured by secondary ion mass spectroscopy (SIMS). The magnesium concentration changes linearly with the flow of Cp$_2$Mg over the range investigated, as shown in FIG. 2, which is a graph showing Cp$_2$Mg flow versus Mg concentration.

Figure 3:
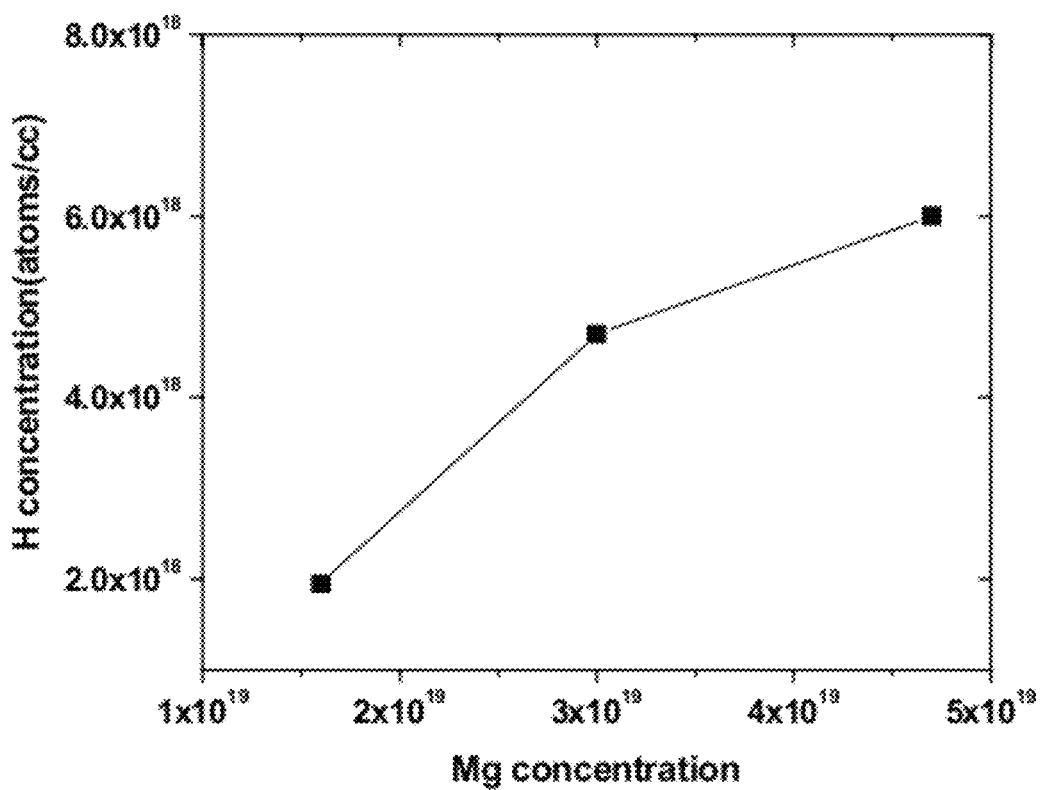
FIG. 3 is a graph showing Mg concentration versus H concentration.

After cooling, the GaN may exhibit p-type conductivity. The conductivity of the semipolar GaN crystal may be enhanced by a subsequent thermal annealing step. The film is removed from the MOCVD reactor and annealed at a temperature of 550° C.-850° C. for 15 minutes. The annealing environment contains a hydrogen deficient ambient gas, such as an inert gas, such as nitrogen or argon, and/or oxygen, relative to the GaN semipolar crystal. Although the concentration of H increases with increasing Mg concentration, post-growth annealing results in a residual H concentration in the p-type semipolar nitride semiconductor layer(s) of less than $1\times10^{19}$ cm$^{-3}$, as shown in FIG. 3, which is a graph showing Mg concentration versus H concentration.

Figure 4:
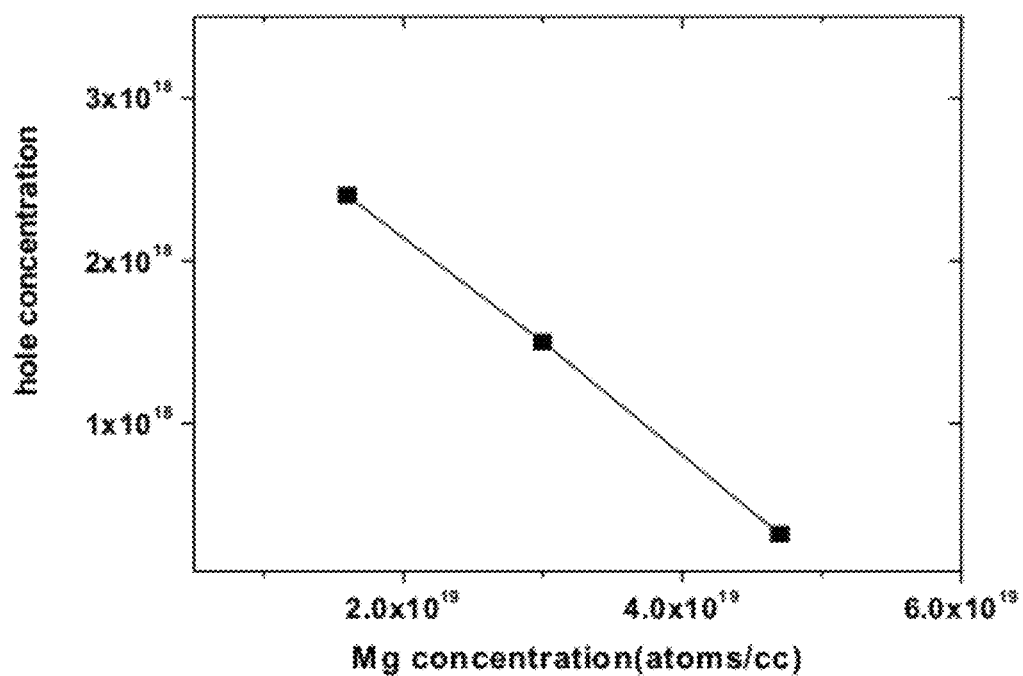
FIG. 4 is a graph showing Mg concentration versus hole concentration.

Hall effect measurements, using the van der Pauw geometry, indicate p-type conductivity of the resulting Mg doped semipolar GaN films. The hole concentration decreases linearly as a function of magnesium concentration from approximately $2.5\times10^{18}$ cm$^{-3}$ to less than $1\times10^{18}$ cm$^{-3}$, as shown in FIG. 4, which is a graph showing Mg concentration [Mg] versus hole concentration.

Figure 5:
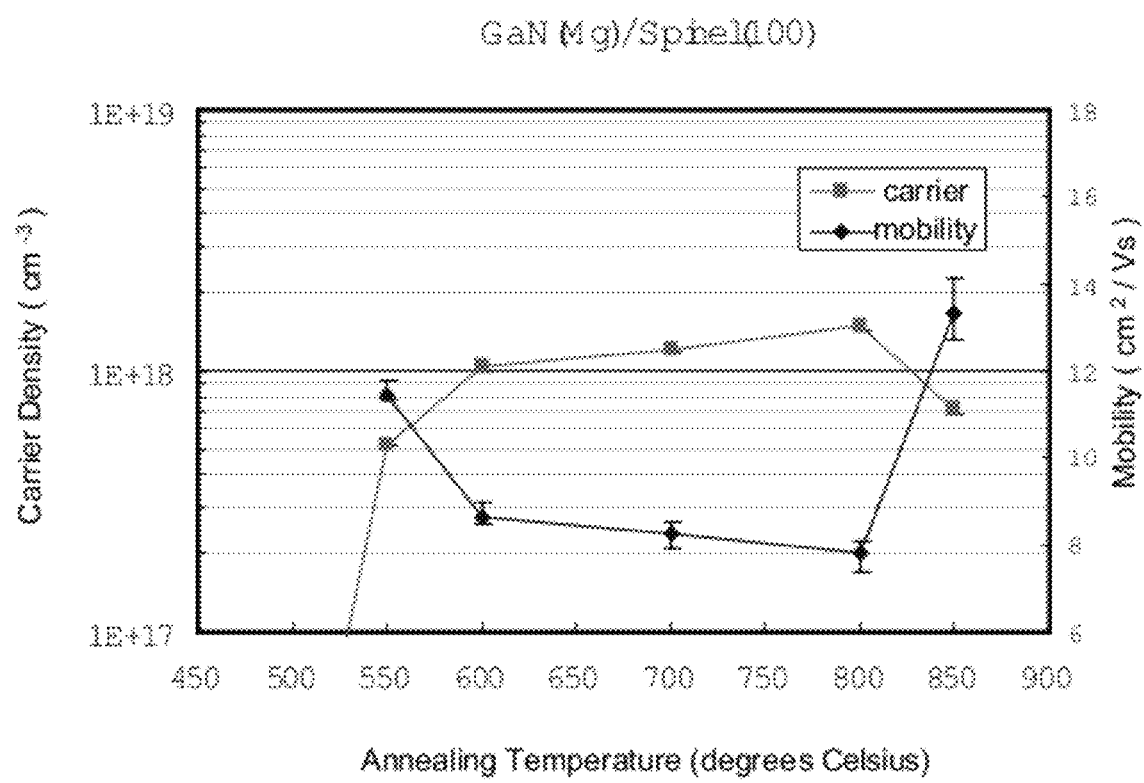
FIG. 5 is a graph showing anneal temperature versus carrier density and mobility, for a constant magnesium concentration, where the data points represented by squares are carrier density and the data points represented by diamonds are mobility.

Optimization of the post growth annealing temperature increases the hole concentration at a constant Mg concentration. Additionally, the measured Hall mobility of the p-type semipolar nitride films varies from approximately 8 cm$^2$/Vs to 14 cm$^2$/Vs. FIG. 5 is a graph showing anneal temperature versus carrier density and mobility, i.e., the effect of annealing temperature on hole concentration and Hall mobility at a constant [Mg], which indicates an optimal annealing temperature of between 550° C.-850° C.

Figure 6:
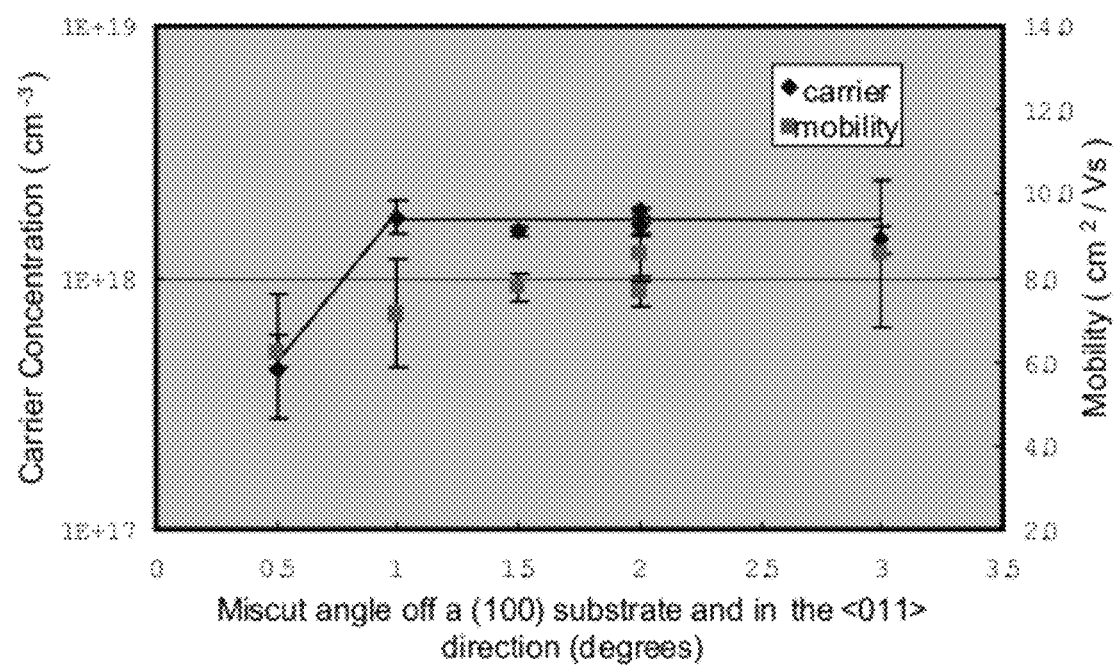
FIG. 6 is a graph showing miscut angle of spinel {100} MgAl$_2$O$_4$, away from the <011> plane, versus carrier concentration and mobility, at a constant magnesium concentration, where the data points represented by squares are mobility and the data points represented by diamonds are carrier concentration.

Finally, the crystal quality and film morphology of heteroepitaxially grown semipolar nitride semiconductor films may be improved through the intentional miscut of the starting substrate. Correspondingly, the use of a miscut substrate increases the hole concentration, at a constant [Mg], from less than $5\times10^{17}$ cm$^3$ to $2\times10^{18}$ cm$^{-3}$, for an increase in the miscut angle from nominally flat to 1.0°. Further increases in miscut angle do not improve the hole concentration, as shown in FIG. 6, which is a graph showing miscut angle versus carrier concentration and mobility, i.e., the effect of the template miscut angle on the hole concentration and Hall mobility at a constant [Mg].

Thus, FIGS. 1-6 illustrate a method for enhancing or tailoring conductivity properties in nitride devices comprising fabricating the nitride device using a doped semipolar nitride semiconductor.

Possible Modifications and Variations

The scope of this invention covers more than just the particular examples cited herein.

For example, this invention is pertinent to all nitrides on any semipolar and nonpolar planes, where it is desirable to achieve p-type conductivity. The controllable conductivity of nitride films has been demonstrated herein by use of a semipolar orientation. However, the methods disclosed herein are suitable for use with any semipolar and nonpolar (Al,In,Ga,B)N. For example, these methods and techniques may be used to achieve controllable p-type conductivity in nonpolar or {10$\bar{1}$3} or {11$\bar{2}$2} semipolar (Al,In,Ga,B)N semiconductor crystals.

Although this specification refers specifically to the heteroepitaxial growth of semipolar nitride layers by MOCVD, the present invention pertains to any growth technique or method of obtaining semipolar or nonpolar nitride semiconductor crystals with a controllable p-type conductivity. For example, p-type semipolar nitride semiconductor crystals could also be grown by MBE, using elemental Mg as the dopant source. Additionally, although Mg is used as the p-type dopant atom, other dopant atoms, given a suitable electronic structure, may also be used, for example Zn. These examples and other possibilities still incur all of the benefits of planar semipolar p-type semiconductor crystals.

Although this specification describes a post-growth annealing step that is used to maximize p-type conductivity of the p-type semipolar crystal films, post-growth annealing may not be necessary for conductivity control of all semipolar (Al,In,Ga,B)N semiconductor crystals. For example, some growth techniques, such as MBE or hydrogen deficient growth environments, may result in residual H concentrations less than $10^{19}$ cm$^{-3}$ prior to annealing.

Additionally, variations in the electronic band structure of semipolar (Al,In,Ga,B)N and/or variations in the electronic states introduced within those crystals by varying doping atoms, may render these semipolar semiconductor films insensitive to unintentional impurities such as H.

The reactor conditions will vary by reactor type and design. The growth described in the process steps above comprises only one set of conditions that has been found to be useful conditions for the growth of semipolar GaN. It was also discovered that these films will grow under a wide parameter space of pressure, temperature, gas flows, and etc., all of which will generate a planar semipolar nitride film.

The annealing temperature, time, and ambient environment may vary depending on the type of annealing system used (e.g., rapid thermal annealing versus tube furnace, etc.), the composition of the semipolar (Al,In,Ga,B)N semiconductor film (e.g., GaN versus Al$_{0.4}$Ga$_{0.6}$N), and the semipolar (Al,In,Ga,B)N semiconductor orientation (e.g., {10$\bar{1}\bar{1}$} versus {11$\bar{2}$2}). Additionally, although the method employed herein uses a secondary annealing system, annealing may also be performed in-situ in the growth system through suitable control of the ambient gas and reactor temperature at sometime after the deposition of the p-type doped semipolar (Al,In,Ga,B)N semiconductor crystal.

The preferred embodiment described the growth of a GaN film on an AlGaN nucleation layer. Other types of nucleation layers that result in a semipolar or nonpolar nitride film can be used. However, the structure grown upon the nucleation layer may be comprised of multiple layers having varying or graded compositions. The majority of nitride devices are comprised of heterostructures containing layers of dissimilar (Al,Ga,In,B)N composition. The present invention can be used for the growth of any nitride alloy composition and any number of layers or combinations thereof. Conductivity control is often used to fabricate functional semiconductor devices. The number of layers, composition, doping type and concentration, and growth conditions of these layers, and annealing parameters may be adjusted for the optimal fabrication and function of these semiconductor devices without differing from the intent and practice of this invention.

Further, although the primary benefits of this invention are realized in the control of p-type conductivity, additional dopants, such as Si may be used to achieve n-type conductivity. The altered symmetry and band structure of semipolar (Al,In,Ga,B)N may also result in improved n-type conductivity in a manner described by this invention. Finally, this invention refers specifically to p-type conductivity control in semipolar (Al,In,Ga,B)N semiconductors. However, the invention covers any (Al,In,Ga,B)N film with a band structure differing from conventional polar nitride orientations. Therefore, this invention includes conductivity control in non-polar (Al,In,Ga,B)N films, such as m-plane or a-plane orientations.

Advantages and Improvements

The existing practice is to grow GaN with the c-plane normal to the surface. This plane has a spontaneous polarization and piezoelectric polarization, which are detrimental to device performance. The advantage of semipolar over c-plane nitride films is the reduction in polarization and the associated increase in internal quantum efficiency for certain devices.

Nonpolar planes could be used to completely eliminate polarization effects in devices. However, these planes are quite difficult to grow, and thus nonpolar nitride devices are not currently in production. The advantage of semipolar over nonpolar nitride films is the ease of growth. It has been found that semipolar planes have a large parameter space in which they will grow. For example, nonpolar planes will not grow at atmospheric pressure, but semipolar planes have been experimentally demonstrated to grow from 62.5 torr to 760 torr, and probably have an even wider range than that.

Practical electronic devices, such as high efficiency light emitting diodes for solid state lighting applications, laser diodes, bipolar transistors, and photovoltaic cells, require the controlled fabrication of semiconductor crystals with selected regions containing n-type or p-type majority carriers. The present invention allows the advantages of semipolar and/or nonpolar (Al,In,Ga,B)N semiconductor crystals to be combined with the controllable conductivity currently used in conventional polar (Al,In,Ga,B)N to produce optoelectronic and electronic devices.

Conventional c-plane oriented nitride semiconductor crystals doped with Mg have p-type carrier concentrations approximately 100 times lower than the Mg dopant concentration due to the electronic band structure of the doped, polar nitride crystal. However, the present invention results in semipolar nitride semiconductor crystals with a p-type carrier concentration only a factor of 10 lower than the Mg dopant concentration. In other words, the doping concentration can be dramatically increased compared to that of polar nitride crystals. This enhanced Mg activation makes the present invention superior to conventional polar nitride p-type doping techniques. Another new feature of the invention results in p-type (Al,In,Ga,B)N films that exhibit both high hole concentrations $>10^{18}$ cm$^{-3}$, while at the same time maintaining Hall mobilities of 8-14 cm$^2$/Vs. In other words, the carrier concentration and mobility can be simultaneously increased or maximized, and are higher than for polar nitrides. Traditional c-plane oriented p-type nitride semiconductor crystal exhibit much lower mobilities for equivalent hole concentrations. The resulting product of hole mobility and concentration results in a higher conductivity for (Al,In,Ga,B)N semiconductor crystal fabricated using this invention.

Further, conventional c-plane oriented nitride semiconductor crystals exhibit isotropic in-plane electronic properties, such as conductivity. However, the reduced symmetry of semipolar nitride semiconductors results in anisotropic in-plane electronic properties. Therefore, it is expected that the conductivity along two orthogonal in-plane lattice directions in a semipolar (Al,In,Ga,B)N device structure will be different. This difference will allow the designer new degrees of freedom in device designs for current spreading, current injection, heat dissipation and light extraction.

Finally, the differing electronic band structure of (Al,In,Ga,B)N semiconductor crystals along semipolar directions results in a lighter hole mass. This, in turn, will lead to higher conductivity, and improved light emitting diode and laser diode performance, relative to conventional polar nitride crystal orientations.

The advantages described in this section also hold true for nonpolar nitrides, since the conductivity properties of semipolar and nonpolar nitrides are very similar. The use of a semipolar or nonpolar plane in order to control the conductivity is novel. Thus, the methods described herein can also be extended to nonpolar semiconductor nitrides.

REFERENCES

The following references are incorporated by reference herein:

[1] S. Nakamura, T. Mukai, M. Senoh, and N. Iwasa, Jpn. J. Appl. Phys., Vol. 31 (1992), pp. L139-L142.
[2] I. Waki, H. Fujioka, M. Oshima, H. Miki, and A Fukizawa, Appl. Phys. Lett. 78 2899 (2001).
[3] U.S. Pat. No. 5,306,662, issued Apr. 26, 1994, to S. Nakamura, et al., entitled "Method of manufacturing P-type compound semiconductor."

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating a semipolar or nonpolar III-nitride semiconductor, comprising:
controlling a p-type conductivity of the semipolar or nonpolar III-nitride semiconductor, by controlling a p-type carrier concentration and a hole mobility in the semipolar or nonpolar III-nitride semiconductor, wherein the p-type carrier concentration is approximately at least 10 percent of a p-type dopant concentration in the semipolar or nonpolar III-nitride semiconductor.

2. The method of claim 1, wherein the p-type III-nitride semiconductor is a semipolar III-nitride semiconductor.

3. The method of claim 1, wherein the doping further comprises incorporating dopants either intentionally or unintentionally in the semipolar or nonpolar III-nitride semiconductor during the deposition step.

4. The method of claim 1, wherein the p-type III-nitride semiconductor is deposited on a miscut substrate.

5. The method of claim 4, wherein the p-type III-nitride semiconductor is the nonpolar III-nitride semiconductor.

6. The method of claim 4, further comprising selecting a miscut angle of a miscut substrate, in order to obtain a desired hole concentration and a hole mobility of the p-type semipolar III-nitride semiconductor.

7. The method of claim 1, wherein the doping comprises varying a flow of Cp$_2$Mg during doping and the flow is varied between 0 and 0.3 µmol/minute.

8. The method of claim 1, further comprising performing a subsequent thermal annealing step, after depositing and doping the p-type III-nitride semiconductor, that alters a concentration of unintentional impurity atoms within the p-type III-nitride semiconductor, and results in an improvement in the conductivity of the p-type III-nitride semiconductor.

9. The method of claim 1, wherein the annealing is to a temperature between 550° C.-850° C.

10. The method of claim 1, wherein the annealing is above 800° C. or at a temperature such that a hole mobility of the p-type III-nitride semiconductor is at least 8 $cm^2/V$ s.

11. The method of claim 1, wherein the semipolar or nonpolar III-nitride semiconductor is Gallium Nitride and further comprising improved conductivity control, with higher carrier concentration, relative to non-annealed GaN.

12. A method of fabricating a p-type III-nitride semiconductor, comprising:
  doping an acceptor impurity into a III-nitride semiconductor, wherein the III-nitride semiconductor is a nonpolar or semipolar III-nitride semiconductor; and
  performing a subsequent thermal annealing step, after doping an acceptor impurity into the III-nitride semiconductor, that alters a concentration of unintentional impurity atoms within the acceptor impurity doped III-nitride semiconductor, and results in an improvement in the conductivity of the acceptor impurity doped III-nitride semiconductor.

13. A method for fabricating a III-nitride device or semiconductor III-nitride, comprising:
  (a) fabricating the III-nitride device or semiconductor III-nitride using an acceptor impurity doped p-type semipolar or nonpolar III-nitride semiconductor; and
  (b) controlling a hole concentration and a hole mobility of the acceptor impurity doped p-type semipolar or nonpolar III-nitride semiconductor, thereby controlling a concentration of the acceptor impurity.

14. A semipolar or nonpolar III-nitride semiconductor, comprising:
  a p-type conductivity based on a controlled hole mobility and a p-type carrier concentration in the semipolar or nonpolar III-nitride semiconductor, wherein the p-type carrier concentration is approximately at least 10 percent of a p-type dopant concentration in the semipolar or nonpolar III-nitride semiconductor.

15. The semiconductor of claim 14, wherein the p-type semipolar or nonpolar III-nitride semiconductor is on or above a miscut substrate.

16. The semiconductor of claim 15, wherein the p-type III-nitride semiconductor is the nonpolar III-nitride semiconductor.

17. The semiconductor of claim 14, wherein the semipolar III-nitride semiconductor comprises GaN.

18. The semiconductor of claim 14, wherein the p-type III-nitride semiconductor comprises the semipolar III-nitride semiconductor.

19. The semiconductor of claim 18, wherein the semipolar III-nitride semiconductor is on or above a {100} $MgAl_2O_4$ spinel substrate miscut in a <011> direction.

20. The semiconductor of claim 19, wherein the semipolar III-nitride semiconductor comprises {10-1-3} III-nitride.

21. The semiconductor of claim 19, wherein the semipolar III-nitride semiconductor comprises {10-11} III-nitride.

22. The semiconductor of claim 18, wherein the semipolar III-nitride semiconductor comprises {10-1-3}, {10-1-1}, {10-12}, {20-21}, {10-14}, or {11-22} III-nitride.

23. The semiconductor of claim 14, wherein the p-type III-nitride semiconductor comprises a-plane or m-plane nonpolar III-nitride and a hole mobility of at least 8 $cm^2$/Vs.

24. The semiconductor of claim 14, further comprising a hole mobility of at least 8 $cm^2/V$ s.

* * * * *